(12) United States Patent
Joshi et al.

(10) Patent No.: US 9,576,085 B2
(45) Date of Patent: *Feb. 21, 2017

(54) SELECTIVE IMPORTANCE SAMPLING (71) Applicant: International Business Machines Corporation, Armonk, NY (US)

(72) Inventors: Rajiv V. Joshi, Yorktown Heights, NY (US); Rouwaida N. Kanj, Round Rock, TX (US); Pranita Kerber, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

This patent is subject to a terminal disclaimer.

(21) Appl. No.: 14/024,234

(22) Filed: Sep. 11, 2013

(65) Prior Publication Data

US 2014/0278296 A1 Sep. 18, 2014

Related U.S. Application Data (63) Continuation of application No. 13/837,900, filed on Mar. 15, 2013, now Pat. No. 9,460,243.

(51) Int. Cl.
G06F 17/50 (2006.01)
(52) U.S. Cl.
CPC .................. *G06F 17/5009* (2013.01)
(58) Field of Classification Search
None
See application file for complete search history.

(56) References Cited

U.S. PATENT DOCUMENTS

| 7,380,225 | B2 * | 5/2008 | Joshi et al. ..................... 716/56 |
| 7,827,018 | B2 | 11/2010 | Adams et al. |
| 8,374,839 | B2 * | 2/2013 | Satoh ............................. 703/14 |

(Continued)

OTHER PUBLICATIONS

Chin-Cheng Kuo; Wei-Yi Hu; Yi-Hung Chen; Jui-Feng Kuan; Yi-Kan Cheng, "Efficient trimmed-sample Monte Carlo methodology and yield-aware design flow for analog circuits," Design Automation Conference (DAC), 2012 49th ACM/EDAC/IEEE , vol., No., pp. 1113-1118, Jun. 3-7, 2012.*

(Continued)

*Primary Examiner* — Omar Fernandez Rivas
*Assistant Examiner* — Robert Brock
(74) *Attorney, Agent, or Firm* — Scully, Scott, Murphy & Presser, P.C.; Louis J. Percello, Esq.

(57) ABSTRACT

Selective importance sampling includes: first phase importance sampling of a plurality of data points to form a first subset of data points; determining a center of gravity of the first subset; determining, based upon the center of gravity, an orthogonal hyperplane; and a second phase importance sampling comprising: determining, for each point in the first subset, whether each point is above the hyperplane; and forming a second subset of data points, wherein the second subset is a subset of the first subset and wherein the second subset excludes each point of the first subset that has been determined to be above the hyperplane. The second subset also excludes all points within an ellipse below the hyperplane. Critical radial distances are determined from binary search or projection of first phase samples onto center of gravity direction as well as the maximal radius of the first subset around the center of gravity.

4 Claims, 6 Drawing Sheets

(56) References Cited

U.S. PATENT DOCUMENTS

| | | | |
|---|---|---|---|
| 8,806,418 B1* | 8/2014 | Jallepalli et al. | 716/136 |
| 2003/0061152 A1* | 3/2003 | De et al. | 705/38 |
| 2006/0100873 A1* | 5/2006 | Bittner et al. | 704/256.2 |
| 2009/0030663 A1* | 1/2009 | Lu | 703/4 |
| 2009/0070716 A1 | 3/2009 | Joshi et al. | |
| 2009/0248387 A1* | 10/2009 | Singhee et al. | 703/16 |
| 2010/0046823 A1 | 2/2010 | O Ruanaidh et al. | |
| 2010/0262414 A1* | 10/2010 | Joshi et al. | 703/14 |
| 2010/0313070 A1* | 12/2010 | Joshi et al. | 714/26 |
| 2011/0153271 A1* | 6/2011 | Tiwary et al. | 702/181 |
| 2011/0153272 A1* | 6/2011 | Tiwary et al. | 702/181 |
| 2011/0313747 A1 | 12/2011 | Joshi et al. | |
| 2012/0046929 A1* | 2/2012 | Joshi et al. | 703/13 |
| 2013/0159947 A1* | 6/2013 | Gattiker et al. | 716/107 |
| 2013/0212444 A1* | 8/2013 | Joshi et al. | 714/718 |
| 2013/0226544 A1* | 8/2013 | Mcconaghy et al. | 703/2 |
| 2013/0246986 A1* | 9/2013 | Kuo et al. | 716/106 |

OTHER PUBLICATIONS

Sun, S.; Li, X.; Liu, H.; Luo, K.; Gu, B., "Fast Statistical Analysis of Rare Circuit Failure Events via Scaled-Sigma Sampling for High-Dimensional Variation Space," Computer-Aided Design of Integrated Circuits and Systems, IEEE Transactions on , vol. PP, No. 99, 14 pages (2015).*

Francis, S.; Kanj, R.; Joshi, R.; Kayssi, A.; Chehab, A., "Statistical methodology for modeling non-IID memory fails events," Quality Electronic Design (ISQED), 2014 15th International Symposium on , vol., No., pp. 205,211, Mar. 3-5, 2014.*

Kanj, R.; Joshi, R., "A novel sample reuse methodology for fast statistical simulations with applications to manufacturing variability," Quality Electronic Design (ISQED), 2012 13th International Symposium on , vol., No., pp. 672,678, Mar. 19-21, 2012.*

Kanj, R.; Joshi, R.; Li, Z.; Hayes, J.; Nassif, S., "Yield estimation via multi-cones," Design Automation Conference (DAC), 2012 49th ACM/EDAC/IEEE , vol., No., pp. 1107,1112, Jun. 3-7, 2012.*

Singhee, A.; Jiajing Wang; Calhoun, B.H.; Rutenbar, R.A., "Recursive Statistical Blockade: An Enhanced Technique for Rare Event Simulation with Application to SRAM Circuit Design," VLSI Design, 2008. VLSID 2008. 21st International Conference on , vol., No., pp. 131-136, Jan. 4-8, 2008.*

Qazi, M.; Tikekar, M.; Dolecek, L.; Shah, D.; Chandrakasan, A., "Loop flattening & spherical sampling: Highly efficient model reduction techniques for SRAM yield analysis," Design, Automation & Test in Europe Conference & Exhibition (DATE), 2010 , vol., No., pp. 801-806, Mar. 8-12, 2010.*

Brayton, R.K.; Hachtel, G.D.; Sangiovanni-Vincentelli, A.L., "A survey of optimization techniques for integrated-circuit design," in Proceedings of the IEEE , vol. 69, No. 10, pp. 1334-1362, Oct. 1981.*

Kanj, Rouwaida et al., "Mixture Importance Sampling and Its Application to the Analysis of SRAM Designs in the Presence of Rare Failure Events," DAC 2006, Jul. 24-28, 2006, San Francisco, California, USA, pp. 69-72.

Vermaak, Jaco et al., "A Sequential Monte Carlo Framework for Extended Object Tracking," Radar, Sonar and navigation, IEEE Proceedings Oct. 2005, pp. 1-22.

Pan, Shao Wei et al., "PYFS—A Statistical Optimization Method for Integrated Circuit Yield Enhancement," IEEE Transactions on Computer-Aided Design of Integrated Circuits and Systems. vol. 12. No. 2. Feb. 1993, pp. 296-309.

Kanj, Rouwaida et al., "An Elegant Hardware-Corroborated Statistical Repair and Test Methodology for Conquering Aging Effects," ICCAD'09, Nov. 2-5, 2009, San Jose, California, USA, pp. 497-504.

Athay, Robert N. "Optimization of Integrated Circuit Design With Respect to Yield," Systems, Man, and Cybernetics, 1997. Computational Cybernetics and Simulation., 1997 IEEE International Conference, pp. 433-438.

* cited by examiner

SELECTIVE IMPORTANCE SAMPLING

RELATED APPLICATION

This application is a continuation of U.S. Ser. No. 13/837,900, filed Mar. 15, 2013, the entire contents of which are incorporated herein by reference.

BACKGROUND

The present disclosure relates generally to the field of selective importance sampling.

In various examples, selective importance sampling may be implemented in the form of methods and/or algorithms.

DESCRIPTION OF RELATED ART

Statistical simulations are critical for yield analysis (e.g., semiconductor yield analysis). Various processes and improved accuracy push for TCAD (Technology for CAD) for manufacturability.

The run-time associated with conventional mixed mode simulations is significant (such mixed mode simulations may be used to speed up Monte Carlo type mechanisms to, for example achieve six-sigma). Similarly, the simulation run-time for conventional physics-based models can be very long (possibly up to 1 or 2 years). Such statistical simulation run-time can be costly (in terms of money (e.g., computing time) and/or lost time to market).

Certain conventional simulations operate by simulating samples, detecting pass/fail and computing a failure rate.

SUMMARY

The present disclosure relates generally to the field of selective importance sampling.

In various examples, selective importance sampling may be implemented in the form of methods and/or algorithms.

In one embodiment, a method implemented in a computer system for performing selective importance sampling on a plurality of data points is provided, the method comprising: performing a first phase importance sampling, by the computer system, of the plurality of data points to form a first subset of data points; determining, by the computer system, a center of gravity of the first subset of data points; determining by the computer system, based at least in part upon the center of gravity, an orthogonal hyperplane; and performing a second phase importance sampling by the computer system, wherein the second phase importance sampling comprises: determining by the computer system, for each point in the first subset of data points, whether each point is above the orthogonal hyperplane; and forming by the computer system a second subset of data points, wherein the second subset of data points is a subset of the first subset of data points and wherein the second subset of data points excludes each point of the first subset of points that has been determined to be above the orthogonal hyperplane.

BRIEF DESCRIPTION OF THE DRAWINGS

Various objects, features and advantages of the present invention will become apparent to one skilled in the art, in view of the following detailed description taken in combination with the attached drawings, in which.

DETAILED DESCRIPTION

Since simulation run-time can be costly, there are a number of options to reduce run-time including reducing the number of samples. Further, the specific set of samples that would impact accuracy less may be identified and removed. Further still, it would be even better if the specific samples that take more run-time could be removed.

In this regard, it is noted that convergence is typically slower in a second phase of importance sampling due to failing stability conditions. Hence, failing samples have increased run-time (most of the samples are failing in second phase of importance sampling as opposed to in a first phase of importance sampling).

Thus, various embodiments provide for selecting a subset of samples in order to maintain a desired accuracy.

For the purposes of description, the term "first phase of importance sampling" is intended to refer to uniform sampling stage for finding the center of gravity.

For the purposes of description, the term "second phase of importance sampling" is intended to refer to the mixture importance sampling phase.

For the purposes of description, the term "center of gravity" is intended to refer to center of the fail region.

For the purposes of description, the term "orthogonal hyperplane" is intended to refer to the hyperplane orthogonal to the direction of the center of gravity.

For the purposes of description, the term "uniform sampling" is intended to refer to the initial phase of importance sampling in an effort to identify a good understanding of the spread of fail samples in the variability space.

Figure 1A:
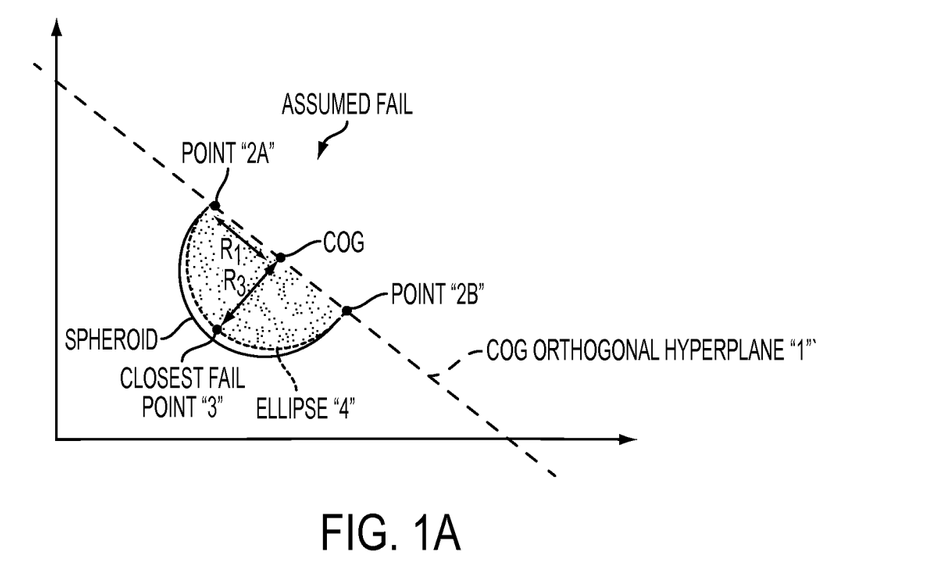
FIGS. 1A and 1B depict diagrams in connection with an embodiment to guide a sample selection.
Figure 1B:
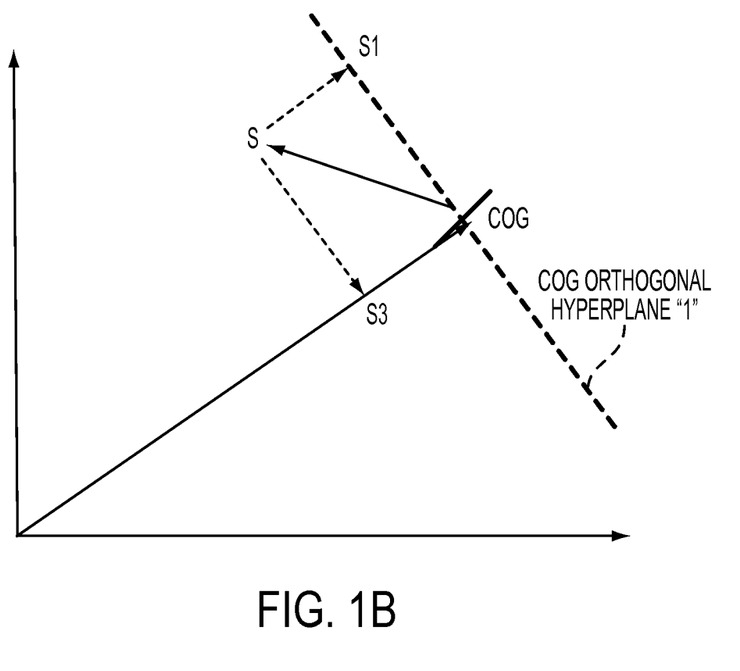

Referring now to FIGS. 1A and 1B, diagrams in connection with an embodiment to guide a sample selection by relying upon COG (center of gravity) information are shown.

It is noted in this example that: (a) the COG is centered well into the location of critically failing samples and hence the fail region; (b) this can provide some guidance to safely failing regions; (c) this is unlike purely closest fail point approach; (d) there is a safe margin for nonlinearity of the boundary for assumed fails; and (e) critical close points are simulated for a true boundary.

Still referring to FIGS. 1A and 1B (and also with reference to FIG. 2), the methodology of this embodiment may operate as follows: (Step 201) perform uniform sampling of a number of samples and find the COG by averaging the coordinates of the failing samples in critical fail regions—end of phase 1; (Step 203)—begin phase 2—identify a set of importance samples, this can be achieved using mixture importance samples based on a conventional sampling function that includes a shifted Gaussian distribution centered around the center of gravity of samples; (Step 205) determine the COG orthogonal hyperplane "1"—the hyperplane can be determined using a point and a normal direction, the point is the COG and the normal direction is determined along the COG vector (from origin to COG); (Step 207) determine the maximum radius "$R_1$" of the spread of importance samples (radius of the spheroid of the samples), this represents spread of points "2A" and "2B" on the COG orthogonal hyperplane "1"; (Step 209) find the closest fail point "3"; (Step 211) identify "$R_3$", as the distance from the COG to point "3"; (Step 213) identify ellipse "4", from "$R_1$" and "$R_3$" and COG directions; and (Step 215) for each importance sample: (i) if point above COG orthogonal hyperplane "1", do not simulate—assume fail; (ii) if point within ellipse "4", do not simulate—assume fail; and (iii) else simulate to predict if pass/fail.

In one specific example, step (e)—find the closest fail point "3"—may be performed by searching along the COG direction; binary search can be employed along COG direction to find the closest failing point 3 to the origin. This define R3 which is maximum distance of fail from COG below hyperplane along COG direction.

Figure 2:
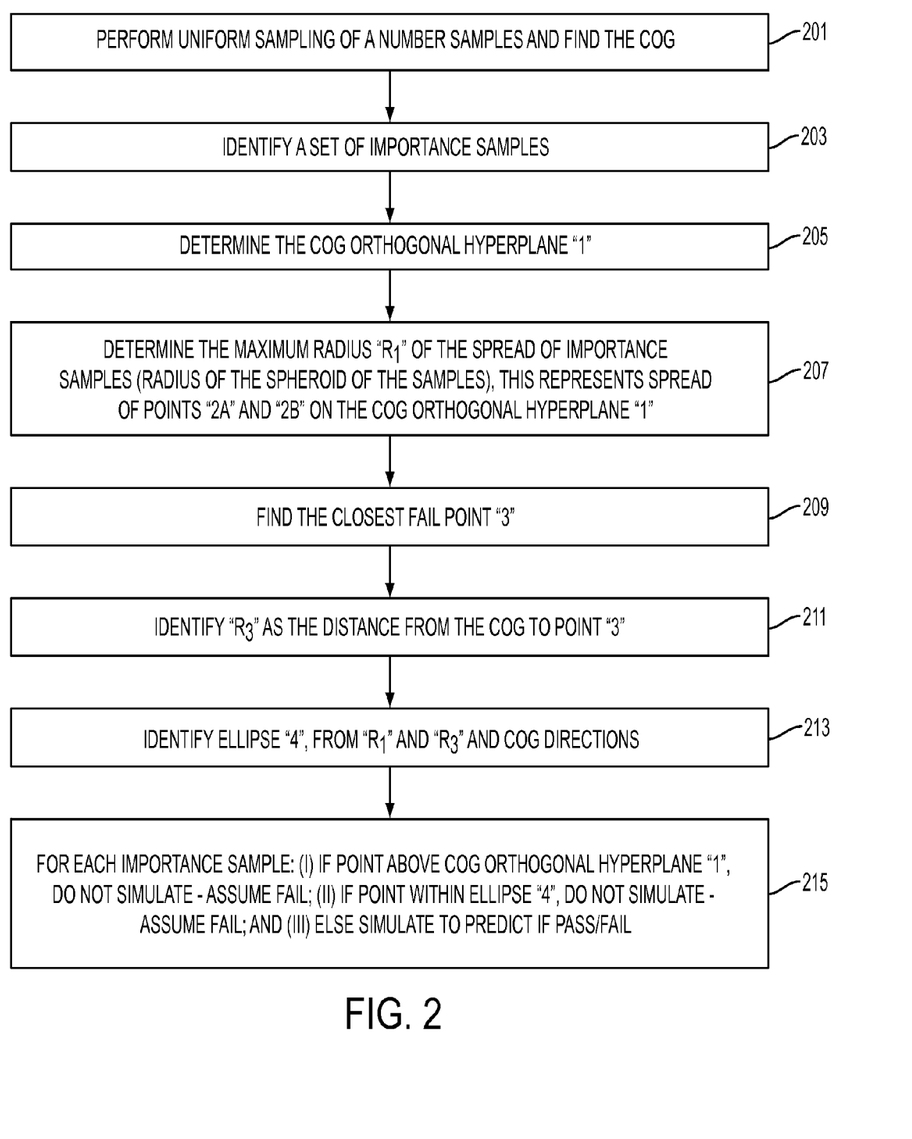
FIG. 2 depicts a flowchart of a method according to an embodiment of the present invention.

In another specific example, step (e)—find the closest fail point "3"—may be performed as follows (see FIGS. 1A, 1B and 2): if individual simulations are expensive and/or to avoid further simulations, find closest projection of 'failed' uniform samples (phase 1) onto COG direction: project failing samples onto COG direction; and find closest projection to origin (that is, S3 in FIG. 2).

In another specific example, step (g)—identify ellipse "4", from "$R_1$" and "$R_3$" and COG directions—may be performed as follows (see FIG. 1 and FIG. 2): (i) given a sample S; (ii) let S3=Project the difference vector (S-COG) that is, S minus COG, onto COG; (iii) S1 is the projection onto COG orthogonal hyperplane "1"; (iv) S is within the ellipse if: $(S1/R1)^2+(S3/R3)^2<1$.

Figure 3:
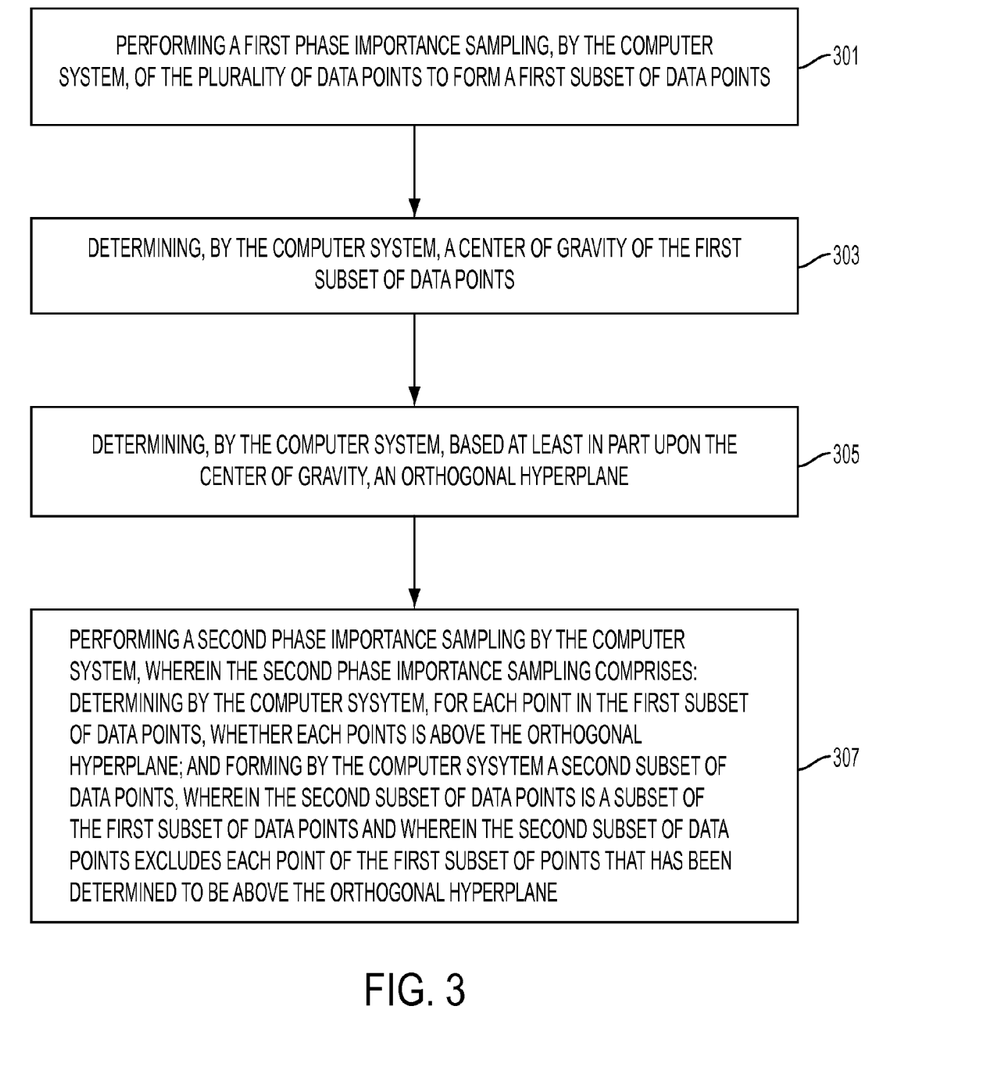
FIG. 3 depicts a flowchart of a method according to an embodiment of the present invention.

Referring now to FIG. 3, a method implemented in a computer system for performing selective importance sampling on a plurality of data points is shown. As seen in this FIG. 3, the method may comprise: at step 301—performing a first phase importance sampling, by the computer system, of the plurality of data points to form a first subset of data points; at step 303—determining, by the computer system, a center of gravity of the first subset of data points; at step 305—determining by the computer system, based at least in part upon the center of gravity, an orthogonal hyperplane; and at step 307—performing a second phase importance sampling by the computer system, wherein the second phase importance sampling comprises: determining by the computer system, for each point in the first subset of data points, whether each point is above the orthogonal hyperplane; and forming by the computer system a second subset of data points, wherein the second subset of data points is a subset of the first subset of data points and wherein the second subset of data points excludes each point of the first subset of points that has been determined to be above the orthogonal hyperplane.

Still referring to FIG. 3, any communications may be carried out via a network. Such a network may comprise the Internet, an intranet, a local area network, a wide area network and/or any other desired communication channel(s). In another example, some or all of the steps of FIG. 3 may be implemented in a computer system of the type shown in FIG. 5.

Figure 4:
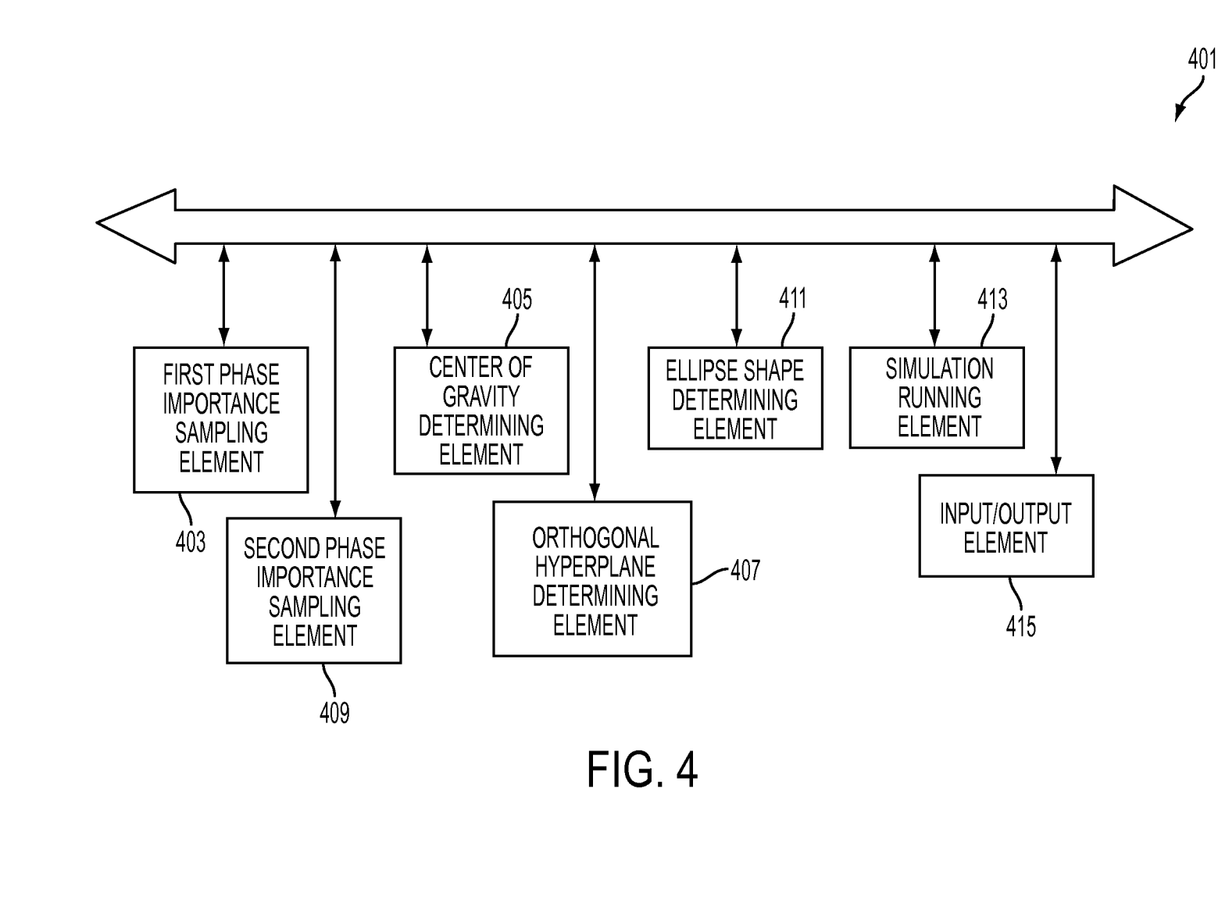
FIG. 4 depicts a block diagram of a system according to an embodiment of the present invention.

Referring now to FIG. 4, a computer-implemented system 401 for performing selective importance sampling on a plurality of data points is shown. As seen in this FIG. 4, the system 401 may comprise: a first phase importance sampling element 403, wherein the first phase importance sampling element is configured to form a first subset of data points; a center of gravity determining element 405 in operative communication with the first phase importance sampling element, wherein the center of gravity determining element is configured to determine a center of gravity of the first subset of data points; an orthogonal hyperplane determining element 407 in operative communication with the center of gravity determining element configured to determine, based at least in part upon the center of gravity, an orthogonal hyperplane; and a second phase importance sampling element 409 in operative communication with the orthogonal hyperplane determining element and the first phase importance sampling element configured to perform a second phase importance sampling, wherein the second phase importance sampling comprises: determining for each point in the first subset of data points, whether each point is above the orthogonal hyperplane; and forming a second subset of data points, wherein the second subset of data points is a subset of the first subset of data points and wherein the second subset of data points excludes each point of the first subset of points that has been determined to be above the orthogonal hyperplane.

Still referring to FIG. 4, system 401 may further comprise an ellipse shape determining element 411 in operative communication with the orthogonal hyperplane determining element configured to determine a shape of an ellipse intersected by the orthogonal hyperplane; wherein the second phase importance sampling element is further configured to determine for each point in the first subset of data points that is not above the orthogonal hyperplane, whether each point in the first subset of data points that is not above the orthogonal hyperplane is within the ellipse.

Still referring to FIG. 4, system 401 may further comprise a simulation running element 413 configured to run a simulation on the second subset of data points.

Still referring to FIG. 4, system 401 may further comprise an I/O (input/output) element 415 for receiving data and outputting data.

In one example, any steps may be carried out in the order recited or the steps may be carried out in another order.

Still referring to FIG. 4, any communications may be carried out via a network. Such a network may comprise the Internet, an intranet, a local area network, a wide area network and/or any other desired communication channel(s). In another example, some or all of the elements of FIG. 4 may be implemented in a computer system of the type shown in FIG. 5. Further, any element may be in operative communication with any other element(s).

Figure 5:
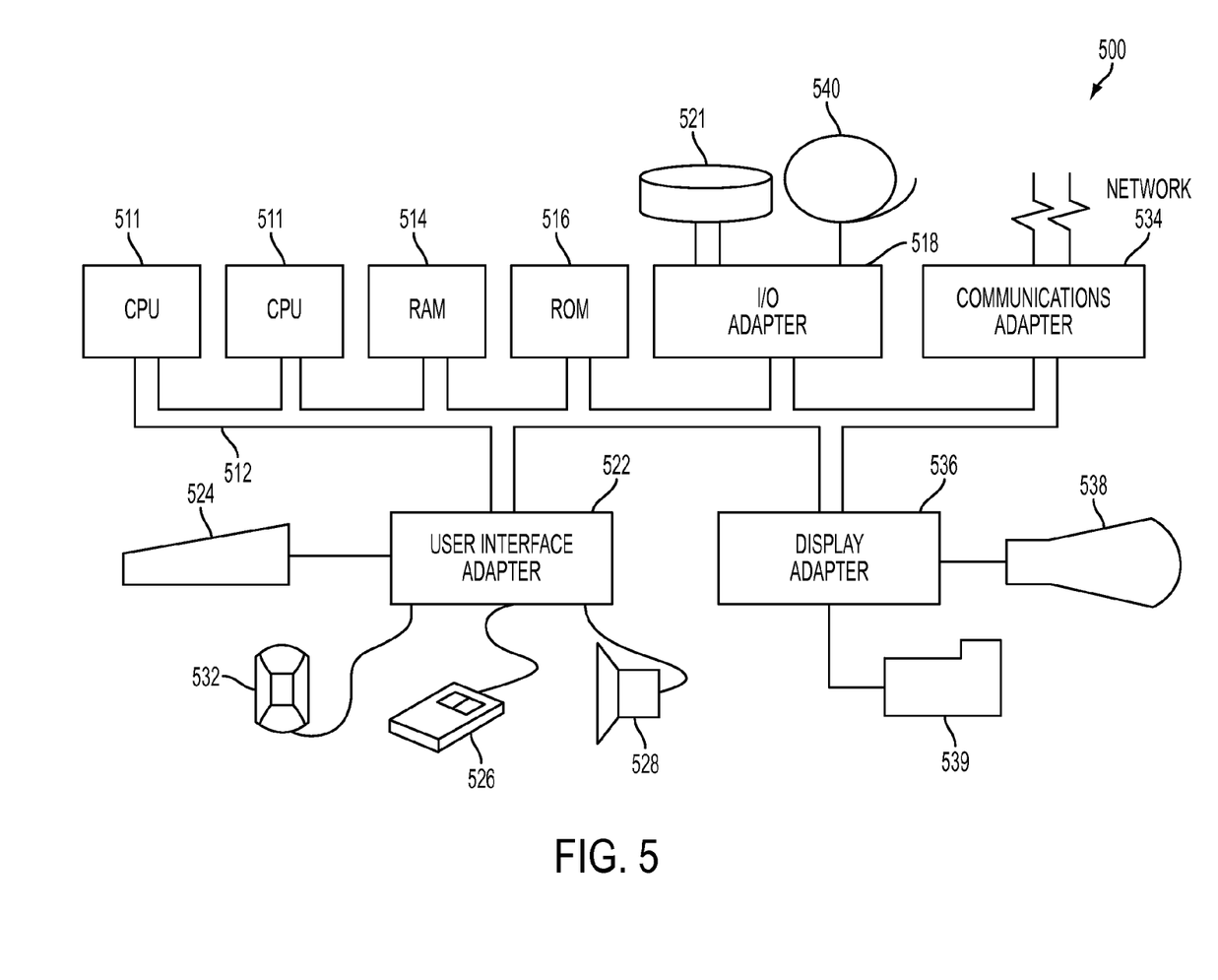
FIG. 5 depicts a block diagram of a system according to an embodiment of the present invention.

Referring now to FIG. 5, this figure shows a hardware configuration of computing system 500 according to an embodiment of the present invention. As seen, this hardware configuration has at least one processor or central processing unit (CPU) 511. The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communications adapter 534 for connecting the system 500 to a data processing network, the Internet, an Intranet, a local area network (LAN), etc., and a display adapter 536 for connecting the bus 512 to a display device 538 and/or printer 539 (e.g., a digital printer or the like).

In one embodiment, a method implemented in a computer system for performing selective importance sampling on a plurality of data points is provided, the method comprising: performing a first phase importance sampling, by the computer system, of the plurality of data points to form a first subset of data points; determining, by the computer system, a center of gravity of the first subset of data points; determining by the computer system, based at least in part upon the center of gravity, an orthogonal hyperplane; and performing a second phase importance sampling by the computer system, wherein the second phase importance sampling comprises: determining by the computer system, for each point in the first subset of data points, whether each point is above the orthogonal hyperplane; and forming by the computer system a second subset of data points, wherein the second subset of data points is a subset of the first subset of data points and wherein the second subset of data points excludes each point of the first subset of points that has been determined to be above the orthogonal hyperplane.

In one example, the first phase importance sampling is uniform sampling.

In another example, the method further comprises: determining, by the computer system, a shape of an ellipse intersected by the orthogonal hyperplane; and determining by the computer system, for each point in the first subset of data points that is not above the orthogonal hyperplane, whether each point in the first subset of data points that is not above the orthogonal hyperplane is within the ellipse.

In another example, the second subset of data points formed by the computer system further excludes each point of the first subset of points that has been determined to be within the ellipse.

In another example, the method further comprises running a simulation by the computer system on the second subset of data points.

In another example, the simulation predicts a pass/fail condition.

In another example, the plurality of data points relate to a yield analysis.

In another example, the yield analysis relates to integrated circuit chip manufacturing.

In another embodiment, a computer readable storage medium, tangibly embodying a program of instructions executable by the computer for performing selective importance sampling on a plurality of data points is provided, the program of instructions, when executing, performing the following steps: performing a first phase importance sampling, by the computer, of the plurality of data points to form a first subset of data points; determining, by the computer, a center of gravity of the first subset of data points; determining by the computer, based at least in part upon the center of gravity, an orthogonal hyperplane; and performing a second phase importance sampling by the computer, wherein the second phase sampling comprises: determining by the computer, for each point in the first subset of data points, whether each point is above the orthogonal hyperplane; and forming by the computer a second subset of data points, wherein the second subset of data points is a subset of the first subset of data points and wherein the second subset of data points excludes each point of the first subset of points that has been determined to be above the orthogonal hyperplane.

In one example, the first phase importance sampling is uniform sampling.

In another example, the program of instructions, when executing, further performs the following steps: determining, by the computer, a shape of an ellipse intersected by the orthogonal hyperplane; and determining by the computer, for each point in the first subset of data points that is not above the orthogonal hyperplane, whether each point in the first subset of data points that is not above the orthogonal hyperplane is within the ellipse.

In another example, the second subset of data points formed by the computer further excludes each point of the first subset of points that has been determined to be within the ellipse.

In another example, the program of instructions, when executing, further performs the following step: running a simulation by the computer system on the second subset of data points.

In another example, the simulation predicts a pass/fail condition.

In another example, the plurality of data points relate to a yield analysis.

In another example, the yield analysis relates to integrated circuit chip manufacturing.

In another embodiment, a computer-implemented system for performing selective importance sampling on a plurality of data points is provided, the system comprising: a first phase importance sampling element, wherein the first phase importance sampling element is configured to form a first subset of data points; a center of gravity determining element in operative communication with the first phase importance sampling element, wherein the center of gravity determining element is configured to determine a center of gravity of the first subset of data points; an orthogonal hyperplane determining element in operative communication with the center of gravity determining element configured to determine, based at least in part upon the center of gravity, an orthogonal hyperplane; and a second phase importance sampling element in operative communication with the orthogonal hyperplane determining element and the first phase importance sampling element configured to perform a second phase importance sampling, wherein the second phase importance sampling comprises: determining for each point in the first subset of data points, whether each point is above the orthogonal hyperplane; and forming a second subset of data points, wherein the second subset of data points is a subset of the first subset of data points and wherein the second subset of data points excludes each point of the first subset of points that has been determined to be above the orthogonal hyperplane.

In one example, the first phase importance sampling is uniform sampling.

In another example, the system further comprises: an ellipse shape determining element in operative communication with the orthogonal hyperplane determining element configured to determine a shape of an ellipse intersected by the orthogonal hyperplane; wherein the second phase importance sampling element is further configured to determine for each point in the first subset of data points that is not above the orthogonal hyperplane, whether each point in the first subset of data points that is not above the orthogonal hyperplane is within the ellipse.

In another example, the second subset of data points further excludes each point of the first subset of points that has been determined to be within the ellipse.

In another example, the system further comprises a simulation running element configured to run a simulation on the second subset of data points.

In another example, the simulation predicts a pass/fail condition.

In another example, the plurality of data points relate to a yield analysis.

In another example, the yield analysis relates to integrated circuit chip manufacturing.

In another embodiment, a statistical methodology with improved runtime (e.g., less than 1 day) is provided.

As described herein, various embodiments may provide methodologies for selective importance sampling. In one specific example, a methodology may be provided to reduce a number of true importance sample simulations with respect to a center of gravity (resulting in, for example, speeding up TCAD-based statistical simulations). In another specific example, a methodology may be provided to determine critical samples in an importance sampling distribution (e.g., critical close points may be simulated for true boundary modeling).

In another example, based on the same number of samples an embodiment may perform a fewer number of true simulations (as compared to conventional implementations).

In another example, an embodiment may provide an 85%-95% simulation savings (% of true simulations to % samples over course of x number of simulations) verses certain conventional methods.

In another example, an embodiment may operate in the context of estimate of yield between 3 and 6 sigma.

In another example, various embodiments may be provided in the context of design automation software.

In another example, various embodiments may be provided in the context computer server(s) and/or computer workstation(s).

In another example, various embodiments may be provided in the context of selective importance sampling, TCAD-based importance sampling and/or filtering of important sample fails.

As described herein, various embodiments may be beneficial to any type of simulation (e.g., a simulation related to yield associated with memory (such as array of MBits or an array of Kbits) or a simulation related to yield associated with semiconductor processor yield).

As described herein, various embodiments may be beneficial to any type of simulation associated with rare failure events (wherein it is desirable to have as low a number of failure events as possible).

As described herein, various embodiments may make use of the fact that conditions of importance in the testing are typically unstable (FAIL) conditions as opposed to stable (PASS) conditions.

In other examples, any steps described herein may be carried out in any appropriate desired order.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any programming language or any combination of one or more programming languages, including an object oriented programming language such as Java, Smalltalk, C++ or the like or a procedural programming language, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described herein with reference to flowchart illustrations and/or block diagrams of methods, systems and/or computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus or other devices provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It is noted that the foregoing has outlined some of the objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the features and applications of the invention. Other beneficial results can be realized by applying the disclosed invention in a different manner or modifying the invention in ways known to those familiar with the art. In addition, all of the examples disclosed herein are intended to be illustrative, and not restrictive.

What is claimed is:

1. A method implemented in a computer system for performing selective importance sampling on a plurality of data points, the method comprising:
   performing a first phase importance sampling, by the computer system, of the plurality of data points to form a first subset of data points, wherein the first phase importance sampling is uniform sampling;
   determining, by the computer system, a center of gravity of the first subset of data points;
   determining by the computer system an orthogonal hyperplane, wherein a location and an orientation of the orthogonal hyperplane are determined using the center of gravity and a normal direction, wherein the normal direction is determined along a vector from the origin to the center of gravity and wherein the determined orthogonal hyperplane passes through the center of gravity; and
   performing a second phase importance sampling by the computer system, wherein the second phase importance sampling comprises:
   generating a second subset of data points by a shifted Gaussian distribution around the center of gravity;
   determining by the computer system, for each point in the second subset of data points, whether each point is above the orthogonal hyperplane; and
   forming by the computer system a third subset of data points, wherein the third subset of data points is a subset of the second subset of data points and wherein the third subset of data points excludes each point of the second subset of data points that has been determined to be above the orthogonal hyperplane;
   wherein the second phase importance sampling further comprises:
   determining, by the computer system, a shape of an ellipse intersected by the orthogonal hyperplane, wherein the shape of the ellipse is distorted compared to an original spread of the Gaussian distribution of the importance samples of the second subset of data points; and
   determining by the computer system, for each point in the second subset of data points that is not above the orthogonal hyperplane, whether each point in the second subset of data points that is not above the orthogonal hyperplane is within the ellipse;
   wherein the third subset of data points formed by the computer system further excludes each point of the second subset of data points that has been determined to be within the ellipse;
   wherein the determining the shape of the ellipse intersected by the orthogonal hyperplane comprises: (a) determining by the computer system a maximum radius $R_1$ of a spread or the projection of the spread of the plurality of data points of the second subset on the orthogonal hyperplane; (b) determining by the computer system the closest fail point to the origin along the direction to the center of gravity that is below the orthogonal hyperplane, the closest fail point being determined from the points of the first subset of points; (c) assigning by the computer system a radius $R_2$ to the distance between the center of gravity and the closest fail point; and (d) determining by the computer system the shape of the ellipse based upon $R_1$ and $R_2$;
   wherein the method further comprises running a simulation by the computer system on the third subset of data points;
   wherein the simulation predicts, based upon the third subset of data points, a pass/fail condition related to a yield analysis for integrated circuit chip manufacturing; and
   wherein the method further comprises outputting the predicted pass/fail condition related to the yield analysis for the integrated circuit chip manufacturing.

2. The method of claim 1, wherein the center of gravity is determined by averaging a plurality of coordinates of a plurality of failing samples.

3. The method of claim 1, wherein the closest fail point is determined using a binary search.

4. The method of claim 1, wherein the closest fail point is determined using a projection of failed simulation points in the first phase on a line between the center of gravity and the origin.

* * * * *